United States Patent
Seitz et al.

(10) Patent No.: US 6,706,634 B1
(45) Date of Patent: Mar. 16, 2004

(54) CONTROL OF SEPARATION BETWEEN TRANSFER GATE AND STORAGE NODE IN VERTICAL DRAM

(75) Inventors: Mihel Seitz, Wappingers Falls, NY (US); Andreas Knorr, Fishkill, NY (US); Irene McStay, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 141 days.

(21) Appl. No.: 09/664,825

(22) Filed: Sep. 19, 2000

(51) Int. Cl.$^7$ .............................................. H01L 21/302
(52) U.S. Cl. ........................ 438/692; 438/700; 438/703
(58) Field of Search ................................ 438/700, 703, 438/692

(56) References Cited

U.S. PATENT DOCUMENTS

| | | | | |
|---|---|---|---|---|
| 5,185,294 A | * | 2/1993 | Lam et al. ................... | 438/554 |
| 5,429,070 A | * | 7/1995 | Campbell et al. ........ | 118/723 R |
| 5,940,717 A | * | 8/1999 | Rengarajan et al. ........ | 438/435 |
| 6,284,593 B1 | * | 9/2001 | Mandelman et al. ........ | 438/248 |

\* cited by examiner

*Primary Examiner*—Nadine G. Norton
*Assistant Examiner*—Lynette T. Umez-Eronini
(74) *Attorney, Agent, or Firm*—Slater & Matsil, L.L.P.

(57) ABSTRACT

A high density plasma deposition process for eliminating or reducing a zipper-like profile of opened-up voids in a poly trench fill by controlling separation between a transfer gate and storage node in a vertical DRAM, comprising:

- etching a recess or trench into poly Si of a semiconductor chip;
- forming a pattern of SiN liner using a mask transfer process for formation of a single sided strap design;
- removing the SiN liner and etching adjacent collar oxide away from a top part of the trench;
- depositing a high density plasma (HDP) polysilicon layer in the trench by flowing either $SiH_4$ or $SiH_4+H_2$ in an inert ambient;
- employing a photoresist in the trench and removing the high density plasma polysilicon layer from a top surface of the semiconductor to avoid shorting in the gate conductor either by spinning on resist and subsequent chemical mechanical polishing or chemical mechanical downstream etchback of the polysilicon layer; and
- stripping the photoresist and depositing a top trench oxide by high density plasma.

14 Claims, 3 Drawing Sheets

15 HDP POLY Si REMOVED →

16

CONTROL OF SEPARATION BETWEEN TRANSFER GATE AND STORAGE NODE IN VERTICAL DRAM

BACKGROUND OF THE INVENTION

1. Field of Invention

The invention relates to an integration scheme for reducing the variation of the Top Trench Oxide (TTO) thickness caused by a zipper-like profile of opened-up voids in a poly trench fill in preparing vertical DRAM memory chips, where the thickness variation is in the same 30 nm range as the final target separation of the conducting, deep trench including buried strap and vertical gate array transistor. Reducing the TTO thickness variation to create a flatter surface improves the process control and reduces the required margins in the fabrication of semiconductor chips in regard to on/off currents and channel length control.

2. Description of the Related Art

DRAM memory chip area optimization normally entails incorporation of the transistor into the capacitor trench. These "chips", also known as electronic integrated circuits are formed by placement and interconnection of selected electronic devices, such as transistors, within a semiconductor substrate. The electronic devices are interconnected using an array of surface conductors carrying data signals through which the devices communicate.

With extensive use of storage device deep trench etches in silicon substrates, the trend in trench technology has moved the access transistor or vertical trench cell (VTC) from the top surface to the trench sidewall, thereby allowing a long channel device and avoiding the short channel effects that degrade trench retention time.

Further, the vertical trench cell (VTC) use of a collar etch/back followed by buried strap poly Si low pressure chemical vapor deposition (LPCVD) deposition and subsequent poly Si etch-back leaves the poly silicon in the recessed region where the collar oxide was etched away. This is done either for the complete collar or, in the case of single sided cell designs, only on one side of the collar (single sided strap). Thereafter, a Top Trench Oxide (TTO) is deposited by high-density plasma (HDP) to isolate the poly Si deep trench fill from poly gate conductor. The TTO thickness control is critical as it determines the channel length and contact from the 'buried strap'(drain) to channel.

When poly Si is deposited into the deep trench by low-pressure chemical vapor deposition (LPCVD), it leaves a seam and voids along the seam in the deep trench, to create a zipper-like profile. During recessing the poly Si to define the top of the transition region between the capacitor and gate conductor (typically 350 nm below the Si surface) the voids and seam are opened in a way such that an undesirable topography is left in the deep trench. The recess is typically accomplished by a dry etch, such as chemical downstream etching (CDE).

The consequences of the zipper-like profile are: poor TTO thickness control; varying channel length; poor or no electrical contact for the deep trench to the transistor; and gate to capacitor leakage.

There are severe problems due to the effective TTO thickness variations within a wafer, from wafer to wafer, and from lot to lot during production of the microelectronic devices, such that device performance is extremely sensitive to these thickness variations. More specifically, the on/off currents and threshold voltage are especially effected by the channel length variations—of which the root cause is attributable to the underlying TTO topography caused by varying shapes of deep trench (DT) poly zipper profile of opened-up voids in the poly trench film, and these opened-up voids are in the same range as the final target separation of trench and array transistor, of about 30 nm.

SUMMARY OF THE INVENTION

The invention process creates a flatter or more even surface of the top trench oxide (TTO) on which there is normally uneven topography caused by the zipper-like profile of opened-up-voids in the poly trench film. In general, the invention process of creating a flatter or more even surface TTO is accomplished through the use of high density plasma (HDP) polysilicon deposition, in which the deposited layers are formed by flowing $SiH_4$ or $SiH_4$ plus additional $H_2$ in an inert ambient such as Ar or He to cause polysilicon films to be deposited. This poly Si layer serves additionally in the BS formation, thereby lending simplicity to the invention process.

DESCRIPTION OF THE PREFERRED EMBODIMENTS

In general, the invention process eliminates or reduces the zipper-like profile by the use of high density plasma (HDP) poly Si to reduce or eliminate uneven topography while simultaneously providing drain contact. The elimination or reduction is attributable to the intrinsic HDP deposition properties of: reducing sputter yields in small spaces (i.e. zipper) and providing sidewall: bottom thickness ratios larger than 1:4.

The HDP polysilicon deposition process of the invention utilizes flowing $SiH_4$, either alone or together with $H_2$ in an inert ambient such as Ar or He to cause polysilicon films to be deposited.

Dopant gases may additionally be used to alter the electrical resistance of intrinsic poly Si.

Further, an anneal post HDP poly deposition may be used to improve the film's structure.

In addition to reduction of topography, the HDP poly Si process also provides the connection of the DT capacitor to the channel (via buried strap (BS) outdiffusion), thereby lending simplification to the invention scheme for BS formation.

Next, the HDP poly Si layer is removed from the surface using a resist mask in conjunction with resist chemical-mechanical polishing (CMP) or resist chemical downstream etching (CDE).

Finally, the top trench oxide process is applied; typically by sacrificial oxidation followed by HDP TTO deposition. The resulting flatter poly silicon surface provides significantly improved critical TTO thickness control.

The invention discovery is that polysilicon may be deposited in a manner similar to that of high-density plasma deposition of $SiO_2$, thereby resulting in non-conformal topography. This non-conformal topography was perceived while optimizing highdensity plasma oxide deposition processes for gapfill, in which silicon layers where used as highlights between different steps.

These silicon layers were deposited by flowing $SiH_4$ in an inert Ar or He ambient, and results in the deposition of polysilicon films exhibiting topography characteristics as in the case of high density plasma oxide processes but with the additional advantage that a flatter surface is created by virtue of using high density plasma polysilicon. The processing conditions utilized in the invention high-density plasma polysilicon deposition process include biased and unbiased deposition at typical reactor pressures below 15 mTorr.

Alternatively, for optimization of the invention process, the silicon layers are deposited by flowing $SiH_4$ plus $H_2$ in an inert Ar or He ambient.

Figure 1:
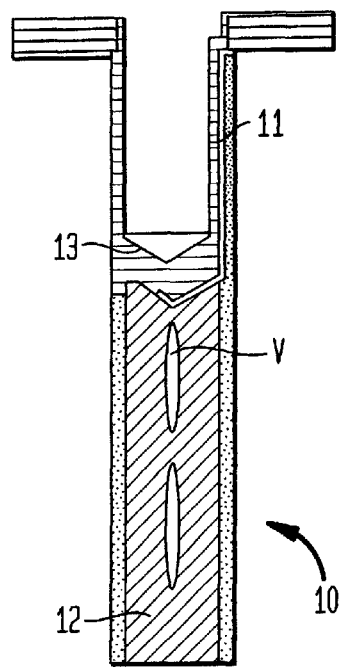
FIG. 1 shows a high density plasma zipper-like profile in a semi-conductor comprising a deep trench.

Reference is now made to FIG. 1, which shows a diagrammatic cross-sectional view of a zipper-like profile in a semi-conductor comprising a deep trench. In FIG. 1, etching has been affected to provide a through recess into the poly Si 12. Subsequently, a mask transfer process is employed to pattern a thin SiN liner 11 that is necessary for the formation of a single sided strap design. Thereafter, the collar oxide 10 is etched away in the top part of the trench. Polysilicon layer 13 is deposited by flowing $SiH_4$ with $H_2$ in an inert ambient of Ar or He or mixtures thereof. Voids in the poly trench are shown at V.

When the SiN liner is removed, the adjacent collar is etched out. The over etch is targeted for about 10% only i.e. 4 nm. Thereafter, 70–100 nm of the high density plasma based poly silicon (13) is deposited with characteristics that are comparable to the top trench oxide (TTO), i.e. with sidewall to bottom ratios larger than 1:4.

Figure 2:
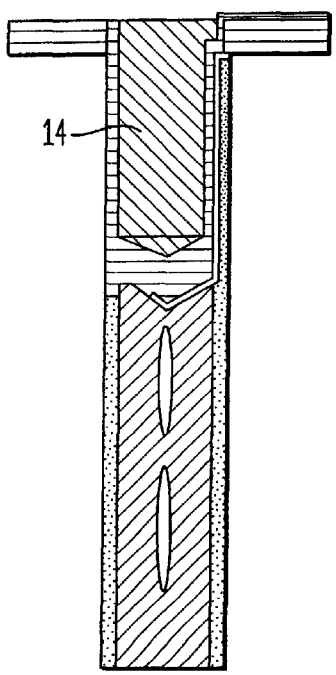
FIG. 2 depicts a high-density plasma zipper-like profile in a semiconductor comprising a deep trench containing a photoresist.

As may be seen from FIG. 2, a photoresist 14 has been applied in the deep trench in order to remove the high density plasma poly Si from the top surface to avoid shorting in the gate conductor (GC), either by spinning on resist and subsequent CMP to the poly Si or CDE etchback.

Figure 3:
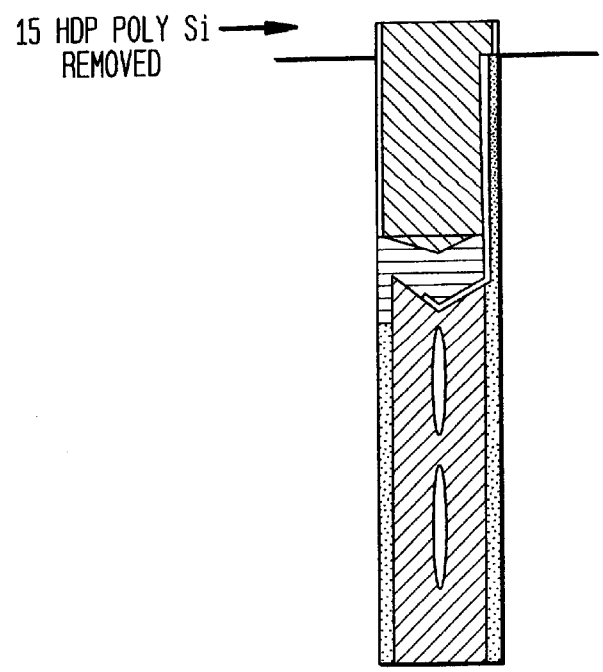
FIG. 3 depicts a high-density plasma zipper-like profile in a semiconductor comprising a deep trench and in which polysilicon has been deposited.

Accordingly, FIG. 3 depicts the structure after the removal of the top silicon layer 15. Thereafter, the photoresist is stripped and the TTO (16) is deposited via HDP as illustrated in FIG. 4.

Figure 4:
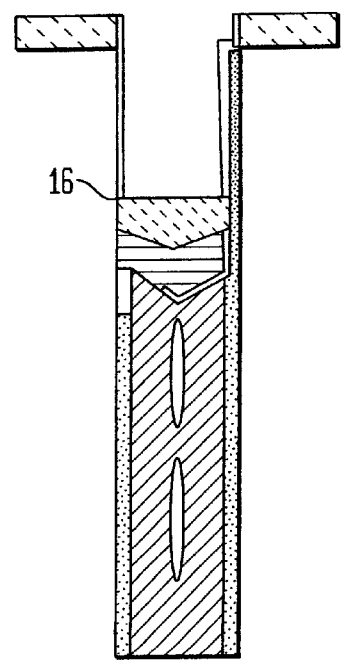
FIG. 4 depicts a high-density plasma zipper-like profile in a semiconductor comprising a deep trench in which photoresist has been removed.

A polysilicon strap (PS) is formed by out diffusion of dopants out of the polysilicon trench in order to form the contact to the transistor channel, as is shown in FIG. 4.

Figure 5:
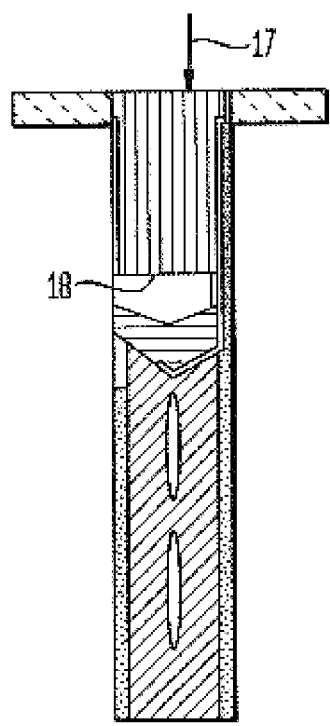
FIG. 5 depicts a high density plasma zipper-like profile in a semiconductor comprising a deep trench in which there is deposition of TTO that started off on topography with less or reduced variation.

Thereafter, the oxide from the top is removed using the same photoresist (17) masking technique that was used for the poly-Si removal as shown in FIG. 5.

Figure 6:
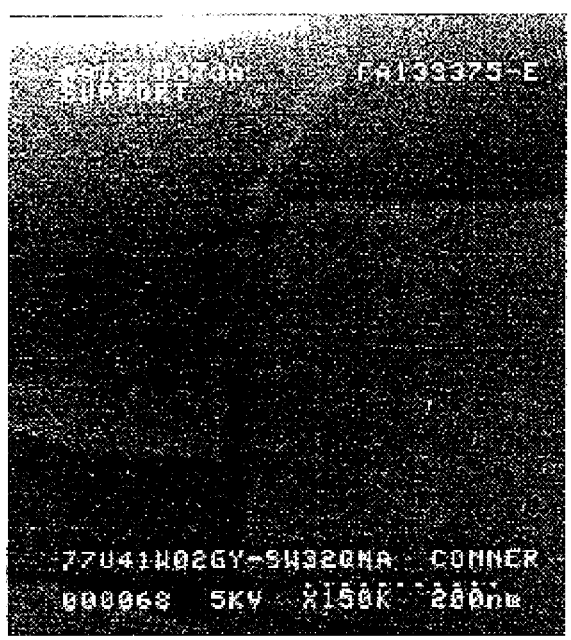
FIG. 6 is a picture of a scanning electron microscope (SEM) showing the deposition profile of a HDP silicon layer sandwiched between HDP oxide layers.

From FIG. 6, the scanning electron micrograph (SEM) shows the deposition profile of the high density plasma polysilicon layer, in this case sandwiched between the HDP oxide layers (solely to show better contrast in SEM analysis). As can be seen the sidewall:bottom thickness ratio is ~1:4. The as-deposited morphology of the high density plasma polysilicon layer may be altered as needed by annealing the Si rich layer to promote grain growth and the drive-in of dopants.

The TTO thickness variation, caused by a zipper-like profile of opened-up voids in the poly trench fill through the use of high density plasma deposition of the oxide is generally in the same range as the final target separation of the trench poly and vertical gate conductor or 30 nm. Therefore, use of the invention process is extremely beneficial in reducing the variation of the TTO for purposes of improving the process control in reducing the required margins when forming VTCs and simplifying the BS formation.

Because the integration scheme of the invention process reduces the TTO thickness variation across trenches, by virtue of introduction of the self-leveling conducting layer formed by flowing $SiH_4$ or $SiH_4$ and $H_2$ in an inert ambient of Ar or He prior to deposition of the TTO, the TTO itself, as can be seen from FIG. 4 has a level approximately parallel to the silicon surface at a depth of 350 nm below surface level.

We claim:

1. A high density plasma deposition process for eliminating or reducing a zipper-like profile of opened-up voids in a poly trench fill in the same range as the final target separation of trench and array transistor of about 30 nm by controlling separation between a transfer gate and storage node in a vertical DRAM, comprising:
   a) etching a recess or trench into poly Si of a semiconductor chip;
   b) forming a pattern of SiN liner using a mask transfer process for formation of a single sided strap design;
   c) removing the SiN liner and etching adjacent collar oxide away from a top part of said trench so that the over etch is targeted for about 10% or 4 nm;
   d) depositing 70–100 nm of a high density plasma (HDP) polysilicon layer in said trench by flowing $SiH_4$ in an inert ambient;
   e) employing a photoresist in said trench and removing said high density plasma polysilicon layer from a top surface of said semiconductor to avoid shorting in the gate conductor either by spinning on resist and subsequent chemical mechanical polishing or chemical mechanical downstream etchback of the polysilicon layer; and
   f) stripping said photoresist and depositing a top trench oxide by high density plasma to obtain sidewall to bottom ratios larger than 1:4.

2. The process of claim 1 wherein said inert ambient is Ar.

3. The process of claim 1 wherein said inert ambient is He.

4. The process of claim 2 wherein said HDP deposition of said polysilicon layer proceeds at a reactor pressure below 15 mTorr.

5. The process of claim 3 wherein said HDP deposition of said polysilicon layer proceeds at a reaction pressure below 15 mTorr.

6. The process of claim 4 wherein said HDP deposition is a biased or unbiased deposition.

7. The process of claim 5 wherein said HDP deposition is a biased or unbiased deposition.

8. A high density plasma deposition process for eliminating or reducing a zipper-like profile of opened-up voids in a poly trench fill in the same range as the final target separation of trench and array transistor of about 30 nm by controlling separation between a transfer gate and storage node in a vertical DRAM, comprising:

a) etching a recess or trench into poly Si of a semiconductor chip;
b) forming a pattern of SiN liner using a mask transfer process for formation of a single sided strap design;
c) removing the SiN liner and etching adjacent collar oxide away from a top part of said trench so that the over etch is targeted for about 10% or 4 nm;
d) depositing 70–100 nm of a high density plasma (HDP) polysilicon layer in said trench by flowing $SiH_4+H_2$ in an inert ambient;
e) employing a photoresist in said trench and removing said high density plasma polysilicon layer from a top surface of said semiconductor to avoid shorting in the gate conductor either by spinning on resist and subsequent chemical mechanical polishing or chemical mechanical downstream etchback of the polysilicon layer; and
f) stripping said photoresist and depositing a top trench oxide by high density plasma to obtain sidewall to bottom ratios larger than 1:4.

9. The process of claim 8 wherein said inert ambient is Ar.

10. The process of claim 8 wherein said inert ambient is He.

11. The process of claim 9 wherein said HDP deposition of said polysilicon layer proceeds at a reactor pressure below 15 mTorr.

12. The process of claim 10 wherein said HDP deposition of said polysilicon layer proceeds at a reactor pressure below 15 mTorr.

13. The process of claim 11 wherein said HDP deposition is a biased or unbiased deposition.

14. The process of claim 12 wherein said HDP deposition is a biased or unbiased deposition.

* * * * *